(12) United States Patent
Akama et al.

(10) Patent No.: US 8,004,851 B2
(45) Date of Patent: Aug. 23, 2011

(54) MULTI-LAYER FLEXIBLE PRINTED CIRCUIT BOARD AND MANUFACTURING METHOD THEREOF

(75) Inventors: Fumio Akama, Tokyo-To (JP); Ryoichi Yoshimura, Tokyo-To (JP); Hideaki Tanaka, Tokyo-To (JP); Hitoshi Uchida, Tokyo-To (JP); Koji Okano, Tokyo-To (JP)

(73) Assignee: Nippon Mektron, Ltd., Tokyo-To (JP)

( * ) Notice: Subject to any disclaimer, the term of this patent is extended or adjusted under 35 U.S.C. 154(b) by 62 days.

(21) Appl. No.: 11/064,458

(22) Filed: Feb. 24, 2005

(65) Prior Publication Data
US 2005/0186713 A1   Aug. 25, 2005

(30) Foreign Application Priority Data

Feb. 24, 2004  (JP) .................................. 2004-047675
Jan. 18, 2005  (JP) .................................. 2005-010654

(51) Int. Cl.
*H05K 7/00* (2006.01)
(52) U.S. Cl. ...................................... 361/760
(58) Field of Classification Search .................. 361/760, 361/398; 174/254, 255
See application file for complete search history.

(56) References Cited

U.S. PATENT DOCUMENTS

| | | | | |
|---|---|---|---|---|
| 3,772,776 A | * | 11/1973 | Weisenburger | 29/830 |
| 4,812,135 A | * | 3/1989 | Smith | 439/493 |
| 5,093,985 A | * | 3/1992 | Houldsworth et al. | 29/830 |
| 5,103,293 A | * | 4/1992 | Bonafino et al. | 257/702 |
| 5,121,297 A | * | 6/1992 | Haas | 361/751 |
| 5,220,488 A | * | 6/1993 | Denes | 361/749 |
| 5,428,190 A | * | 6/1995 | Stopperan | 174/261 |
| 5,457,881 A | * | 10/1995 | Schmidt | 29/852 |
| 5,742,484 A | * | 4/1998 | Gillette et al. | 361/789 |
| 5,822,850 A | * | 10/1998 | Odaira et al. | 29/846 |
| 5,865,934 A | * | 2/1999 | Yamamoto et al. | 156/295 |
| 6,535,261 B1 | * | 3/2003 | Anno et al. | 349/147 |
| 6,762,942 B1 | * | 7/2004 | Smith | 361/749 |
| 6,797,891 B1 | * | 9/2004 | Blair et al. | 174/268 |
| 6,902,949 B2 | * | 6/2005 | Yamazaki et al. | 438/106 |
| 7,075,794 B2 | * | 7/2006 | Gall et al. | 361/749 |
| 2003/0080678 A1 | * | 5/2003 | Kim et al. | 313/504 |
| 2006/0131965 A1 | * | 6/2006 | Friedland | 310/12 |

FOREIGN PATENT DOCUMENTS

| | | |
|---|---|---|
| JP | 05-259646 | 10/1993 |
| JP | 09-293966 | 11/1997 |
| JP | 02000114280 | * 4/2000 |

(Continued)

*Primary Examiner* — Jinhee J Lee
*Assistant Examiner* — Abiy Getachew
(74) *Attorney, Agent, or Firm* — Jacobson Holman PLLC (57) ABSTRACT

A method for easily making a barrier for preventing overflow of interlayer insulating resin in a cable-fitted multi-layer FPC that uses bumps for connecting the layers, and a barrier having a structure that can easily be made. In a method for manufacturing a multi-layer flexible printed circuit board including a circuit section, a cable section that is connected to the circuit section, the circuit section having a multi-layer structure of insulating resin arranged between multiple layers of metal foil, a barrier, that stops the insulating resin from overflowing, has a two-row configuration and is formed on a metal foil that constitutes an outermost conductive layer in the multi-layer flexible printed circuit board, and the metal foil and the insulating resin are laminated to form the multi-layer flexible printed circuit board.

2 Claims, 7 Drawing Sheets

FOREIGN PATENT DOCUMENTS

| | | |
|---|---|---|
| JP | 2000-269642 | 9/2000 |
| JP | 2001-185854 | 7/2001 |
| JP | 2001-326459 | 11/2001 |
| JP | 2002-141664 | 5/2002 |
| JP | 2002-368369 | 12/2002 |
| JP | 2003-229665 | 8/2003 |

* cited by examiner

MULTI-LAYER FLEXIBLE PRINTED CIRCUIT BOARD AND MANUFACTURING METHOD THEREOF

BACKGROUND OF THE INVENTION

1. Field of the Invention

This invention relates to a multi-layer flexible printed circuit having a circuit section and a cable section that is connected to the circuit section, and a manufacturing method thereof. This invention particularly relates to countermeasures for preventing overflow of interlayer insulating resin in a multi-layer flexible printed circuit (hereinafter abbreviated as "multi-layer FPC") in which layers are connected together by a conductive bump.

2. Description of the Related Art

A multi-layer circuit board is made by laminating a predetermined number of conductive layers of metal foil by using interlayer insulating resin. When laminating, it is necessary to allow the interlayer insulating resin a certain amount of flow, so as to bury it between the interlayer circuit patterns.

Consequently, in a multi-layer FPC whose cable section is made by using the inner layer of a circuit section, when laminating the outermost conductive layers and the interlayer insulating resin in a laminating press, the resin component used in the interlayer insulating resin overflows onto the inner layer cable section of the multi-layer FPC.

Figure 10:
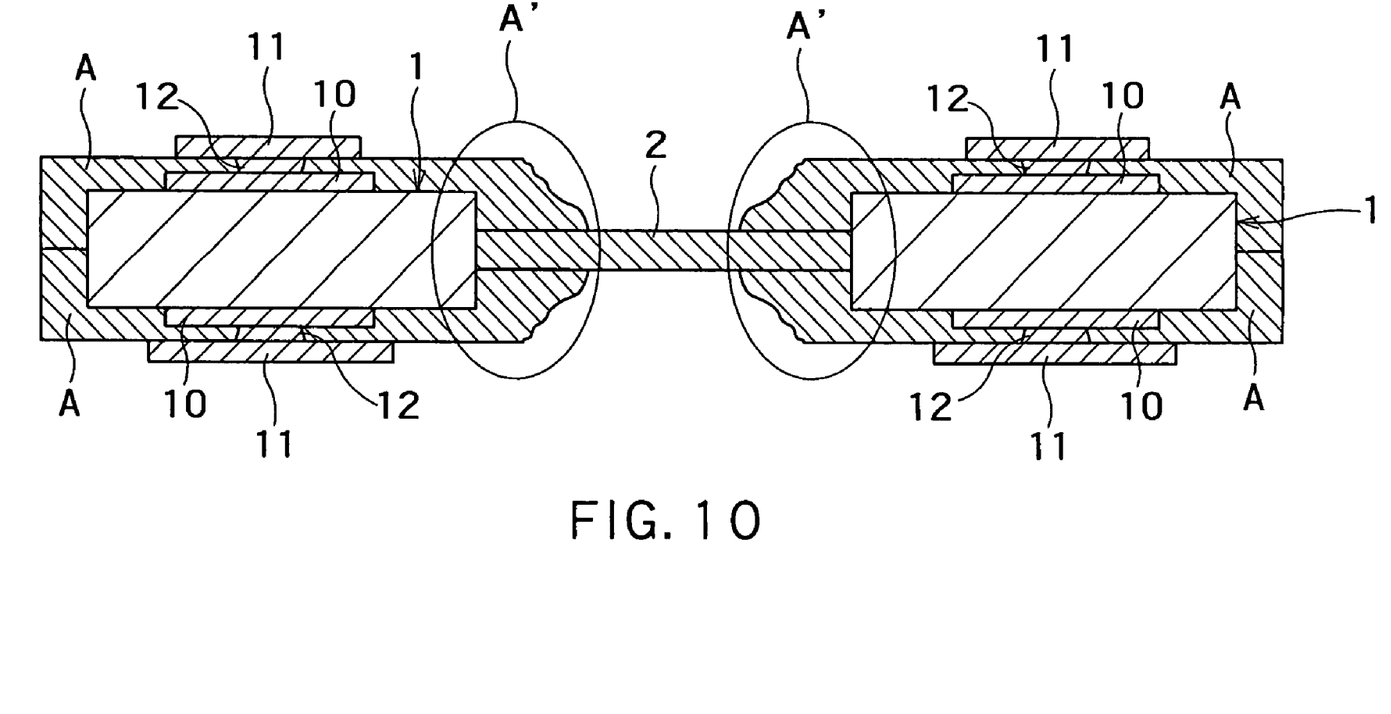
FIG. 10 is a side cross-sectional view of a conventional cable-fitted multi-layer FPC.

FIG. 10 depicts a state where the resin component has overflowed. In the cable-fitted multi-layer FPC, a cable 2 is extracted from an inner layer multi-layer board 1. The outer layer conductive layer 10 of the inner layer multi-layer board 1 is connected to the outermost layer conductive layer 11 of the multi-layer FPC by a bump for interlayer connection 12, and an interlayer insulating resin A is filled between the conductive layers. In this example, the interlayer insulating resin A flows along the cable 2, forming an extended section A' from the side face of the inner layer multi-layer board 1 to the cable 2.

The extended section A' of FIG. 10 is inconvenient, since it peels due to tearing caused by warping of the cable 2, appears unsightly when completed, and such like.

Countermeasures, such as those in Japanese Patent Application Laid-open No. 2002-141664, have been proposed to prevent the interlayer insulating resin A from overflowing. Here, part of a sheet adhesive inserted between board layers is thermally hardened to form a wall that prevents the resin component from overflowing.

Japanese Patent Application Laid-open No. 2001-326459 proposes another method for connecting layers of a circuit board, in which two conductive layers are connected by a conductive bump provided on one of them.

Since the method of Japanese Patent Application Laid-open No. 2002-141664 uses a hardened part of the resin itself as a wall to prevent overflow, a certain amount of flow and overflow of resin is unavoidable when heating during the laminating process. While a resist wall may be added to further suppress resin overflow, as described in Japanese Patent Application Laid-open No. 2002-141664, this requires an extra process and increases the cost.

Japanese Patent Application Laid-open No. 2001-326459 describes interlayer continuity using a conductive bump. In comparison with conventional methods of drilling an NC hole and making a hole by laser, this method achieves a high density of interlayer continuity at low cost. However, it gives no consideration to the overflow of interlayer insulating resin onto the cable section of the multi-layer FPC.

SUMMARY OF THE INVENTION

This invention has been realized in consideration of the points mentioned above, and aims to provide a method of easily forming a barrier for preventing overflow of interlayer insulating resin in a multi-layer FPC fitted with a cable by using a bump to connect the layers, and a barrier having a structure that can be easily formed.

According to the invention, in a manufacturing method of a multi-layer flexible printed circuit board having an interlayer conductive connection structure that uses a conductive bump, the method comprises forming an inner layer circuit board having a flexible cable section, and a multi-layer circuit section that the cable section is attached to in a single piece; forming, on a metal foil that is laminated on the inner layer circuit board with an insulating resin in between, a bump that conductively connects the layers, and a barrier that stops the insulating resin from overflowing; and laminating the metal foil and the insulating resin onto the inner layer circuit board.

According to the invention, in the manufacturing method of the multi-layer flexible printed circuit board, after the barrier stops the insulating resin from overflowing, the barrier is removed by etching at the same time as a step of etching a pattern formation.

According to the invention, a multi-layer flexible printed circuit board comprises a circuit section, a cable section that is connected to the circuit section, the circuit section having a multi-layer structure of insulating resin arranged between multiple layers of metal foil, and a barrier that stops the insulating resin from overflowing. The barrier has a two-row configuration, and is provided on a metal foil that constitutes the outermost conductive layer in the multi-layer flexible printed circuit board.

According to the invention, a multi-layer flexible printed circuit board comprises a circuit section, a cable section that is connected to the circuit section, the circuit section having a multi-layer structure of insulating resin arranged between multiple layers of metal foil, and a barrier that is partially open so as to allow the insulating resin to flow.

According to the invention, a multi-layer flexible printed circuit board comprises a circuit section, a cable section that is connected to the circuit section, the circuit section having a multi-layer structure of insulating resin arranged between multiple layers of metal foil, a conductive bump for conductively connecting the layers, the conductive bump being provided at an interconnecting section of the metal foil, and a conductive pad for connecting to the conductive bump, the conductive pad having a larger connection area than the conductive bump.

Since it is configured as described above, the present invention obtains the following advantageous effects.

According to the invention, the bump that conductively connects the layers, and the barrier that stops the insulating resin from overflowing, are formed on the metal foil that constitutes the outermost conductive layer of the cable-fitted multi-layer FPC. This enables the conductive bump and the barrier to be formed in a single step that does not require additional special work, thereby preventing the flow of the resin in a simple step at low cost.

According to the invention, after the insulating resin has stopped flowing, the barrier is removed by etching at the same time as etching the pattern formation, obtaining a cable-fitted multi-layer FPC that has no barrier.

According to the invention, the two-row configuration of the barrier prevents overflow more reliably.

According to the invention, the open part of the barrier allows excess resin to be led inside the barrier, further preventing it from flowing outside.

According to the invention, the conductive pad, that joins with the conductive bump to achieve electrically connection, has a larger connection area than the conductive bump, making the connection between the conductive bump and the conductive pad more reliable.

A cable-fitted multi-layer FPC having an even greater number of layers can be manufactured by repeating the steps of this invention.

BRIEF DESCRIPTION OF THE DRAWINGS

FIGS. 2 (a) to 2 (h) are side cross-sectional views of manufacturing steps of the FPC of FIG. 1;

FIGS. 7 (a) and (b) are plan views of examples of configurations of copper foil used in this invention, FIG. 7 (a) depicting one having a one-fold continuous flow-stopping frame, and FIG. 7 (b), one having a two-fold configuration;

FIGS. 8 (a) and (b) are plan views of examples of configurations of copper foil used in this invention, FIG. 8 (a) depicting one having a one-fold non-continuous flow-stopping frame, and FIG. 8 (b), one having a two-fold configuration;

FIGS. 9 (a) and (b) are plan views of examples of configurations of copper foil used in this invention, FIG. 9 (a) depicting one having a combination of continuous and non-continuous flow-stopping frames, and FIG. 9 (b), flow-stopping frames having openings.

DETAILED DESCRIPTION OF THE EMBODIMENT

An embodiment of the present invention will be explained with reference to FIGS. 1 to 9.

Figure 1:
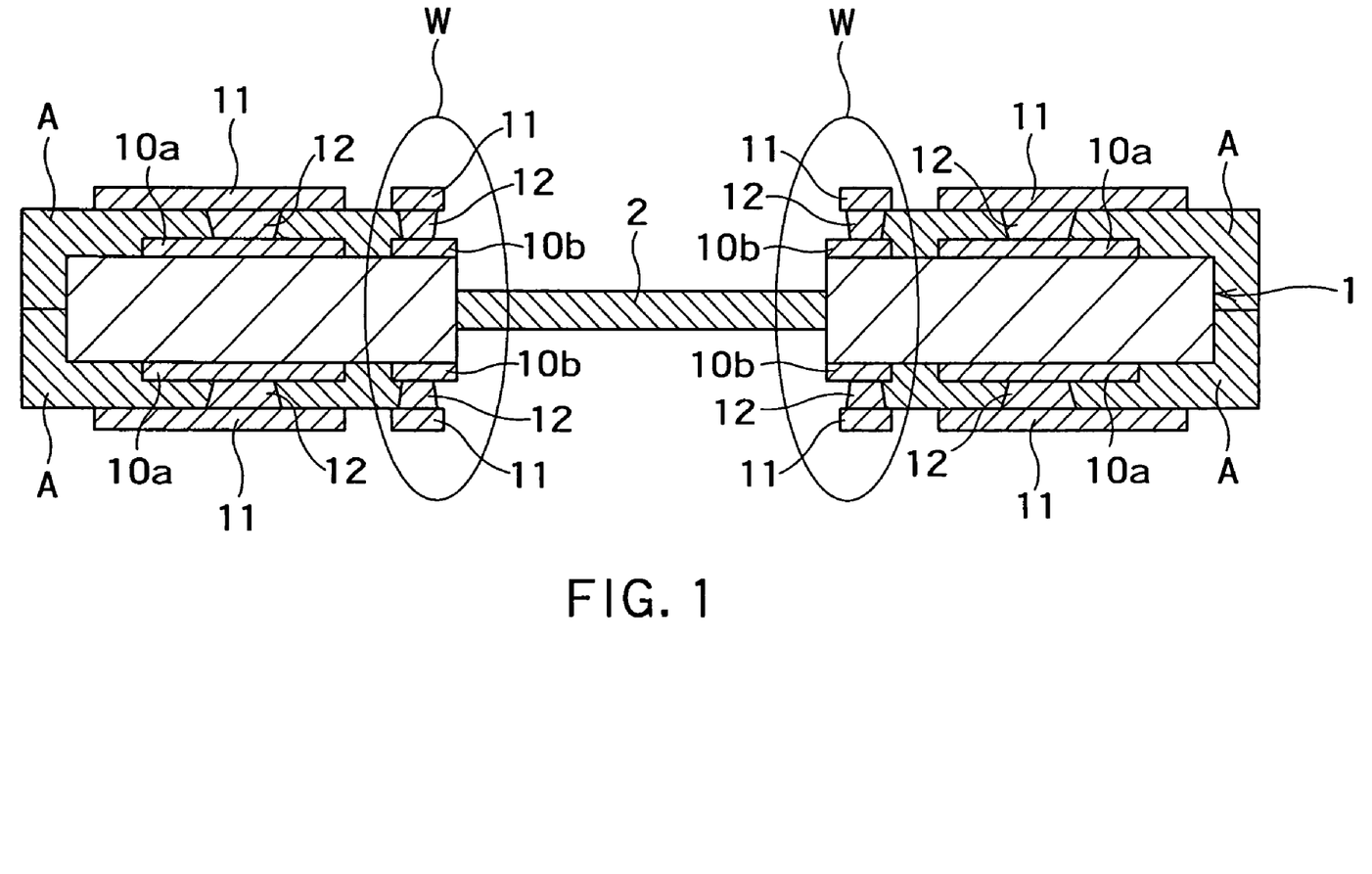
FIG. 1 is a vertical cross-sectional view of the configuration of a cable-fitted multi-layer FPC manufactured according to this invention.

FIG. 1 is a vertical cross-sectional view of a multi-layer FPC fitted with a cable according to this invention. In FIG. 1, outer layer conductive layers 10, FPC outermost conductive layers 11, and interlayer-connecting bumps for connecting these layers, form barriers W at ends of the inner layer multi-layer boards 1 that connect to the cable 2.

While the object of the barriers W is basically to prevent the interlayer insulating resin A from overflowing onto the cable 2, they can be used for connecting to ground interconnections that function as conductors, and also increase the strength of the FPC.

Figure 2:
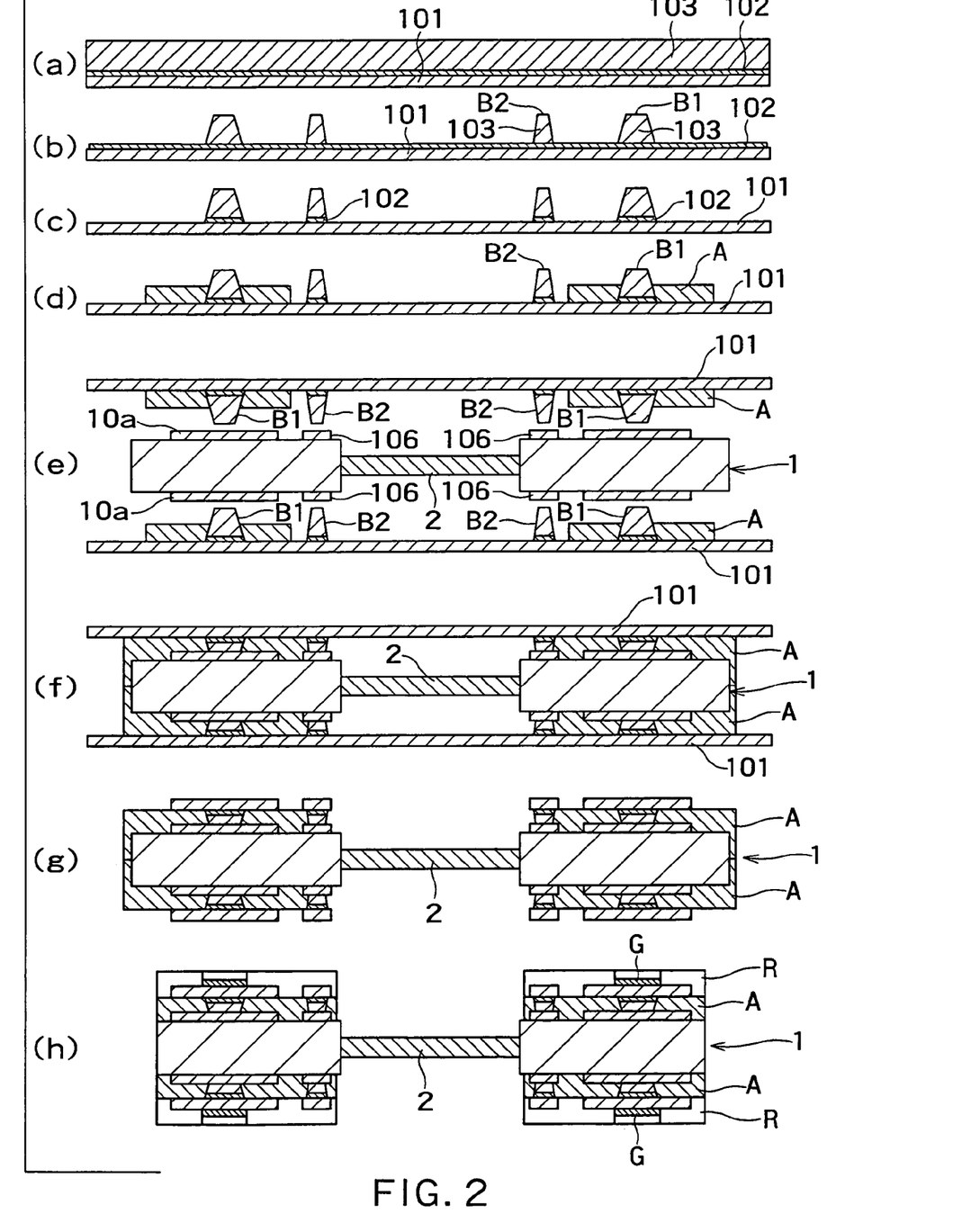

FIGS. 2 (a) to 2 (h) depict manufacturing steps of the cable-fitted FPC of FIG. 1. FIG. 2 (a) depicts a metal foil having a three-layer structure including a copper foil 101, a nickel foil 102, and a copper foil 103. Copper and nickel are used to enable one of them to be selectively etched. The copper foil 103 is used to form a bump in a later step.

Photo-resists are formed on both faces of the three-layered metal foil, and exposure/development/etching is performed to make bumps B1 and B2 in the copper foil 103, as shown in FIG. 2 (b). Bump B1 is used for interlayer connection, and bump B2 is used as a barrier.

As shown in FIG. 2 (c), the nickel layer 102 is removed by selectively etching; then, as shown in FIG. 2 (d), the interlayer insulating resin A is pressed in a vacuum laminating press. Unneeded parts of the interlayer insulating resin A are cutaway beforehand as required by using a blade or the like.

FIGS. 2 (e) to (h) are steps of manufacturing a cable-fitted multi-layer FPC by using copper foil having bumps and interlayer insulating resin, made by executing the above processes.

In the step of FIG. 2 (e), two sheets of copper foil that have been processed as far as the step of FIG. 2 (d) are arranged on the top and bottom faces of the inner layer FPC 1, with their faces that include the bumps B1 and B2 facing the inner layer FPC 1, and the bumps B1 and B2 directly contacting pads 10a and 10b of the inner layer FPC 1. This arrangement is then pressed in a vacuum heating press and cured.

When pressing in the vacuum heating press, while the high temperature and high pressure cause the interlayer insulating resin A to flow between the layers, filling the spaces between them, the barrier B2 stops the interlayer insulating resin A from flowing to the cable 2. FIG. 2 (f) depicts the state after the interlayer insulating resin sheet has been pressed in a vacuum heating press and cured.

As shown in FIG. 2 (g), a photosensitive resist is formed and treated by exposure, development and etching, thus unneeded parts of the copper foil 101 are removed by etching. This obtains a cable-fitted multi-layer FPC.

As shown in FIG. 2 (h), a solder resist R is formed and the required surface processing layer G is formed by nickel plating, gold plating, or the like. The external appearance is processed to obtain a product. While the barriers B2 of FIG. 2 are needed for resin that flows, they may be removed when there is no longer a need to prevent such flow.

Figure 3:
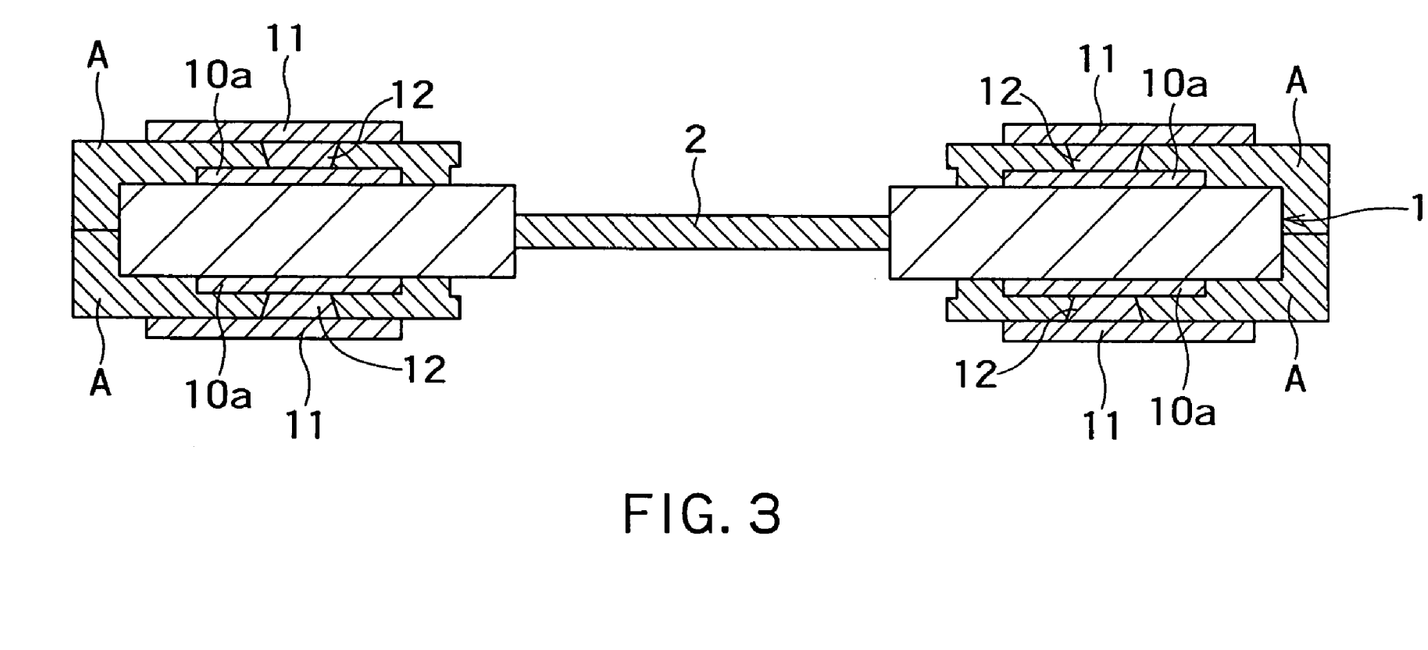
FIG. 3 is a side cross-sectional view of the configuration of a cable-fitted multi-layer FPC, made by removing a barrier B2 by etching at the same time as removing an outer layer circuit from the FPC of FIG. 2 (f) by etching.

FIG. 3 depicts the state after the barrier B2, processed until step (f) of FIG. 2, is removed by etching at the same time as a circuit pattern is etched.

To remove the barrier B2 by etching, following step (f) of FIG. 2, the barrier B2 is exposed to an etching fluid without forming an etching resist over it. The action of the etching fluid that etches the circuit pattern simultaneously removes the barrier B2.

Figure 4:
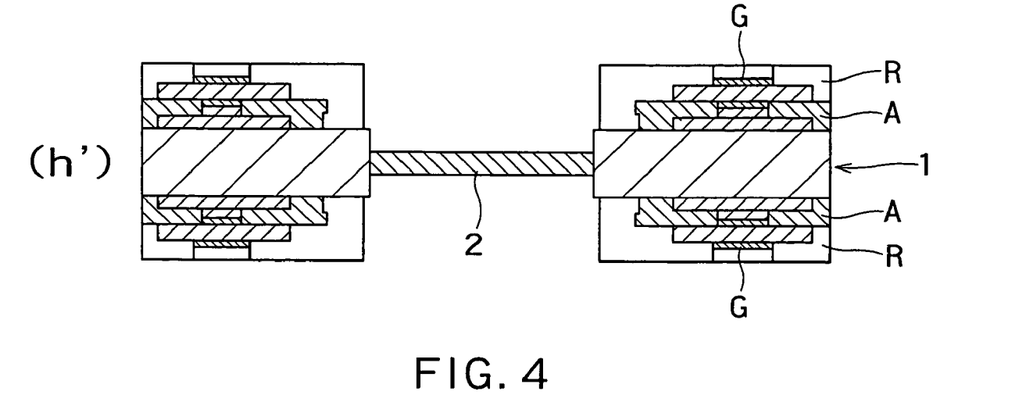
FIG. 4 is a side cross-sectional view of a solder resist formed on the FPC of FIG. 3.

FIG. 4 depicts the state when the circuit pattern in step (g') of FIG. 3 is etched at the same time as removing a barrier W by etching, a solder resist R is then formed, and the required surface processing section G is added, followed by cutting of the external appearance. This achieves a cable-fitted FPC having the cross-sectional structure of FIG. 4 (h'). The other steps (a) to (f) are the same as those in FIG. 2, and are not illustrated in FIG. 4.

Figure 5:
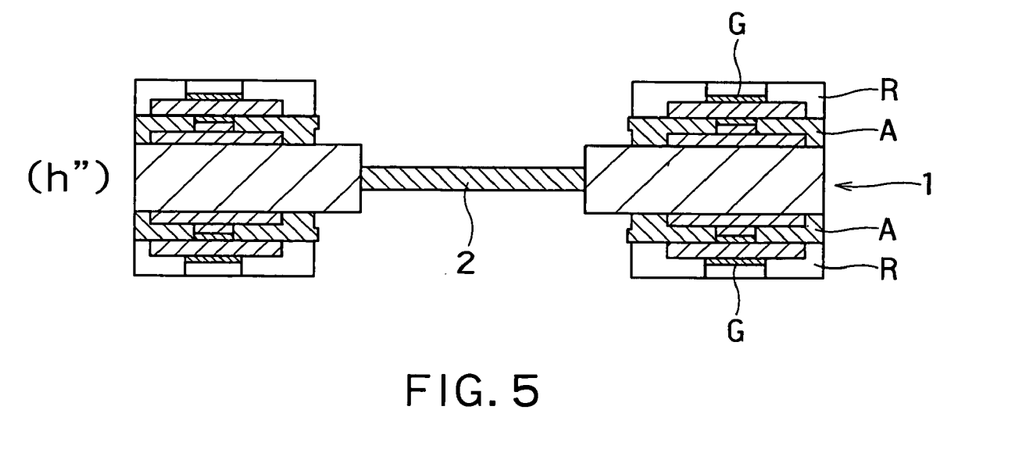
FIG. 5 is a side cross-sectional view of another example of a solder resist formed on the FPC of FIG. 3.

FIG. 5 depicts a step (h"), being an example where the formation range of the solder resist R in FIG. 4 (h') is stopped before the position of the barrier W, i.e. at the top of the interlayer insulating resin A.

Figure 6:
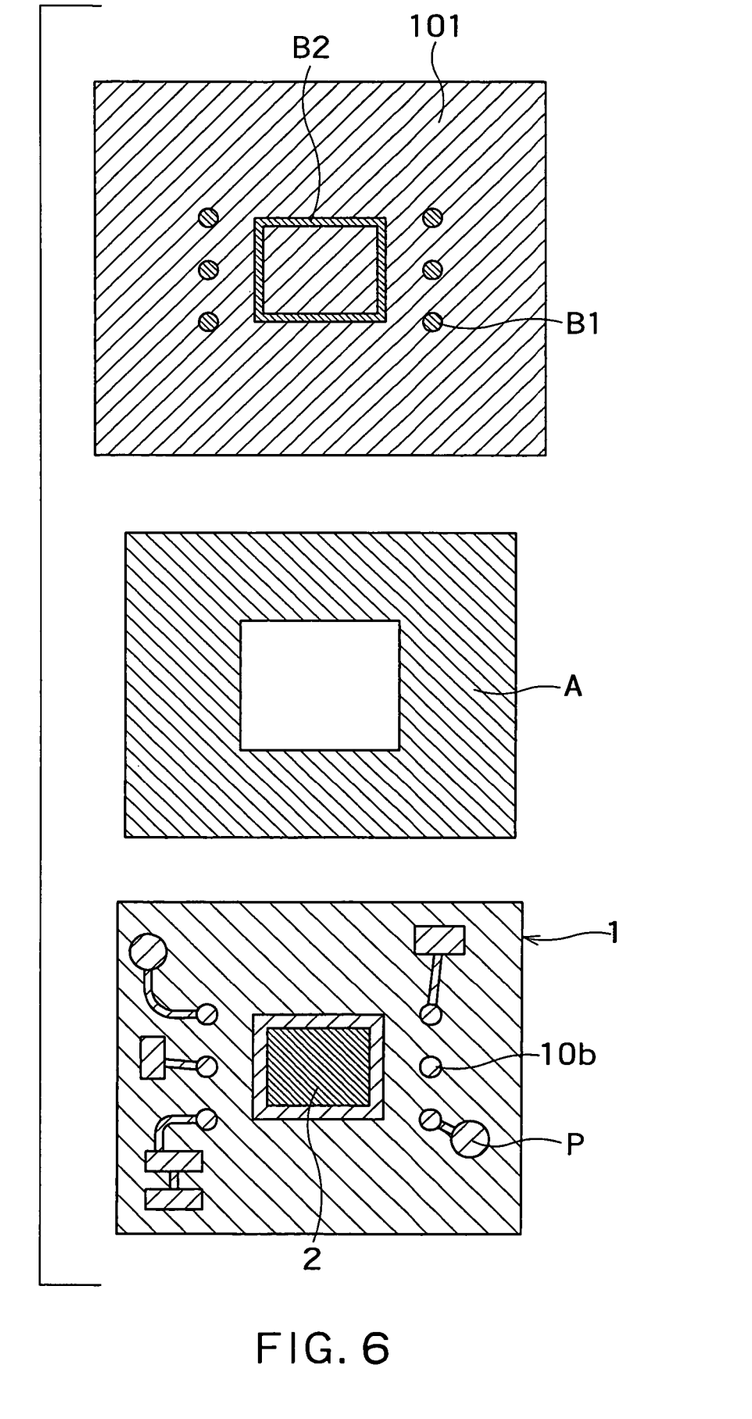
FIG. 6 is a plan view of a copper foil, an interlayer insulating adhesive sheet, and an inner layer multi-layer board, used in the FPC of FIG. 1.

FIG. 6 depicts plan views of the three elements that are laminated in step (e) of FIG. 2, i.e. the multi-layer FPC 1, the copper foil 101, and the interlayer insulating resin A.

A barrier B2 for preventing resin overflow is provided in the center of the copper foil 101, and a bump B1 for interlayer connection is provided near the barrier B2. The left and right sides of the multi-layer FPC 1 are circuit sections, and there is an exposed section for the cable 2 in the center. A pad P2 for joining to the bump B1 is formed near the exposed section. The interlayer insulating resin A is cutaway near the cable exposed section.

Figure 7:
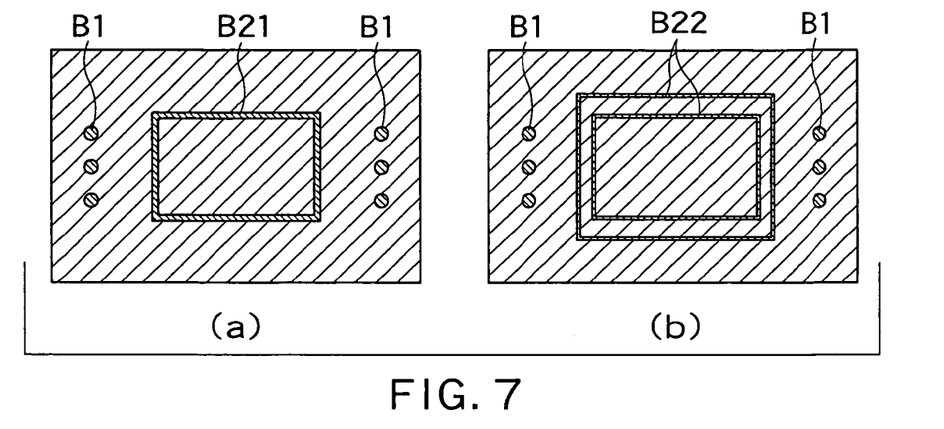
Figure 8:
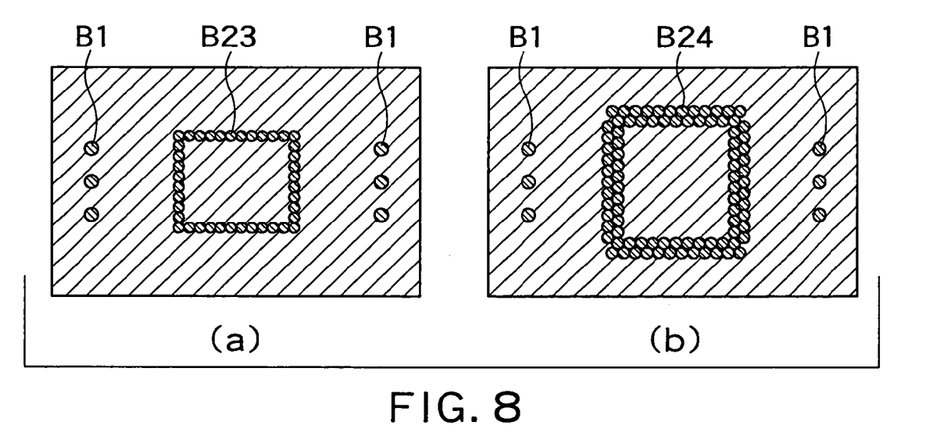

FIGS. 7 to 9 depict examples of bumps on the copper foil 101 as B21 to B26. FIG. 7 (*a*) depicts a basic shape, where a frame-like bump B21 has a continuous shape that acts as a one-fold barrier against resin overflow, and is provided at the center of bumps B1 for interlayer connection. FIG. 7 (*b*) depicts a two-fold bump B22, FIG. 8 (*a*) depicts a non-continuous one-fold bump B23, and FIG. 8 (*b*) depicts a non-continuous two-fold bump B24. The non-continuous bumps use the viscosity of the resin to stop it from flowing.

Figure 9:
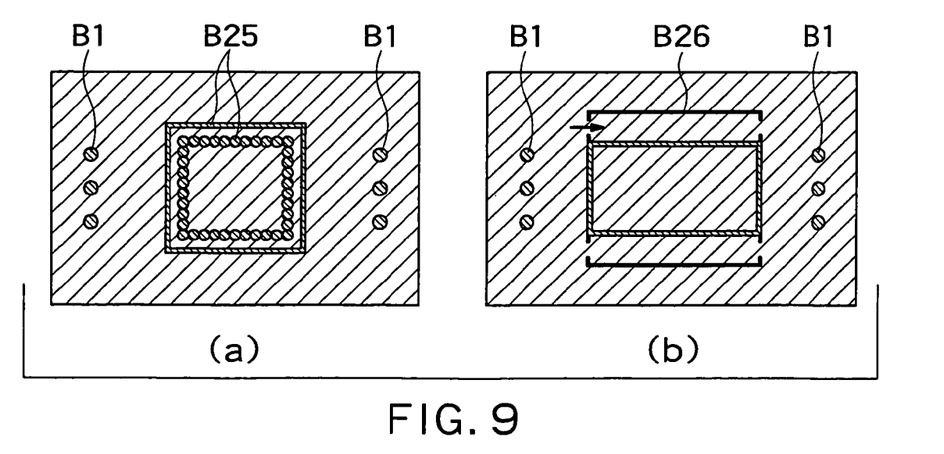

FIG. 9(*a*) depicts a two-fold arrangement of bumps B25, one of which is continuous while the other is non-continuous. FIG. 9(*b*) depicts a combination of continuous bumps B26 having openings, provided on each side of a continuous bump. The sections on both sides of the cable connecting to the openings accommodate the overflow of resin.

What is claimed is:

1. A multi-layer flexible printed circuit board comprising:
   a circuit section;
   a cable section connected to the circuit section, the circuit section having a multi-layer structure of insulating resin arranged between multiple layers of metal foil; and
   a barrier that is partially open so as to allow the insulating resin to flow, wherein the circuit section having a multi-layer structure of insulating resin arranged between multiple layers of metal foil, a conductive bump for conductively connecting the layers, the conductive bump being provided at an interconnecting section of the metal foil, and a conductive pad for connecting to the conductive bump, the conductive pad having a larger connection area than the conductive bump.

2. A multi-layer flexible printed circuit board comprising:
   a circuit section;
   a cable section connected to the circuit section, the circuit section having a multi-layer structure of insulating resin arranged between multiple layers of metal foil;
   a conductive bump penetrating the insulating resin for conductively connecting the layers, the conductive bump being provided at an interconnecting section of the metal foil; and
   a conductive pad for connecting to the conductive bump, the conductive pad having a larger connection area than the conductive bump.

* * * * *